United States Patent
Takaishi

(10) Patent No.: US 7,879,702 B2
(45) Date of Patent: Feb. 1, 2011

(54) METHOD FOR MANUFACTURING A SEMICONDUCTOR DEVICE INCLUDING A MEMORY CELL ARRAY AREA AND PERIPHERAL CIRCUIT AREA

(75) Inventor: Yoshihiro Takaishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 533 days.

(21) Appl. No.: 11/773,666

(22) Filed: Jul. 5, 2007

(65) Prior Publication Data

US 2008/0014727 A1    Jan. 17, 2008

(30) Foreign Application Priority Data

Jul. 7, 2006    (JP)    ............... 2006-187779

(51) Int. Cl.
    *H01L 21/425*    (2006.01)
(52) U.S. Cl. ............... 438/514; 257/610; 257/E21.645
(58) Field of Classification Search ............... 438/514; 257/610, E21.645–21.649
    See application file for complete search history.

(56) References Cited

U.S. PATENT DOCUMENTS 6,461,911 B2 * 10/2002 Ahn et al. .................. 438/253

7,572,711 B2 * 8/2009 Park et al. ................... 438/396

FOREIGN PATENT DOCUMENTS

| JP | 2000-357747 | 6/1999 |
| JP | 2001-145087 | 5/2001 |
| JP | 2001-284467 | 10/2001 |
| JP | 2003-006530 | 1/2003 |
| JP | 2003-152071 | 5/2003 |
| JP | 2003-186905 | 6/2003 |
| JP | 2006-120832 | 5/2006 |

OTHER PUBLICATIONS

Japanese Office Action. Translation of pertinent information provided.
Japanese Office Action with Translations.

* cited by examiner

*Primary Examiner*—Matthew C Landau
*Assistant Examiner*—Sonya D McCall Shepard
(74) *Attorney, Agent, or Firm*—Whitham Curtis Christofferson & Cook, PC

(57) ABSTRACT

A method for manufacturing a semiconductor device includes the consecutive steps of selectively implanting first-conductivity-type impurities into a silicon substrate in a memory cell array area to form first source/drain regions, heat treating to diffuse the impurities in the first source/din regions; selectively implanting impurities into the silicon substrate in a peripheral circuit area to form second source/drain regions in the peripheral circuit area.

6 Claims, 7 Drawing Sheets

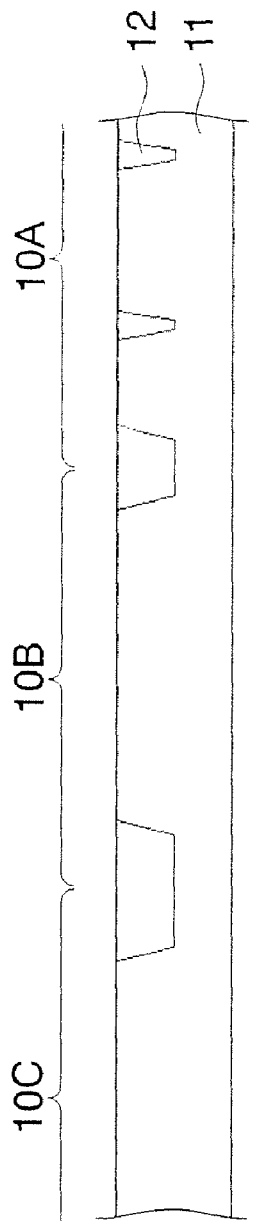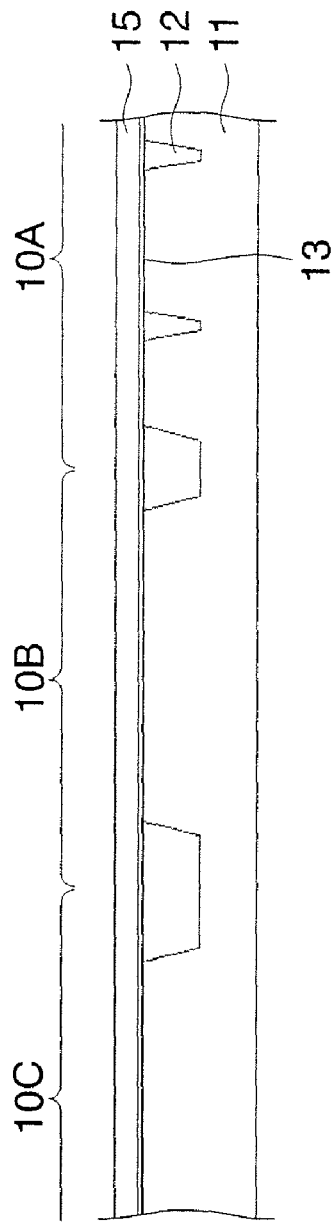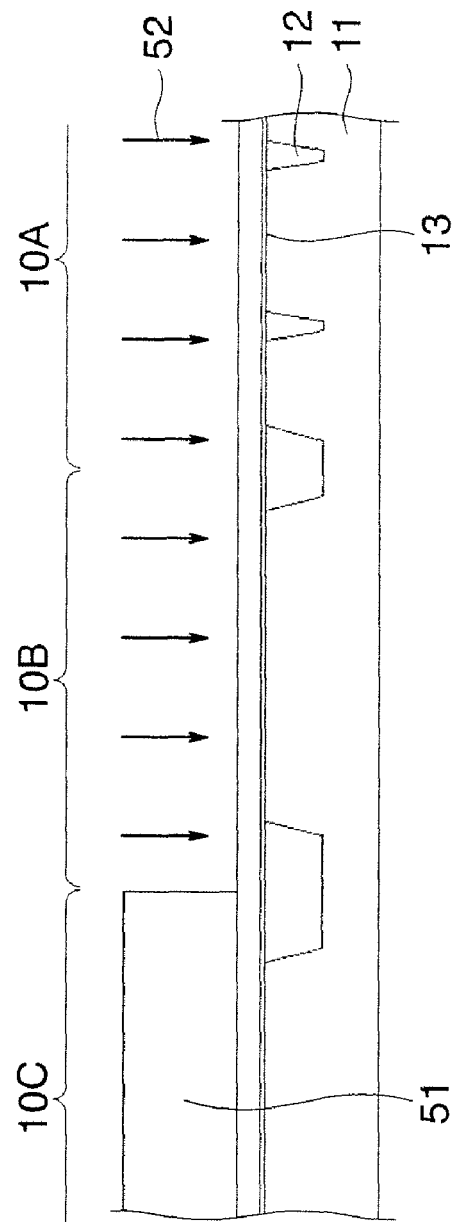

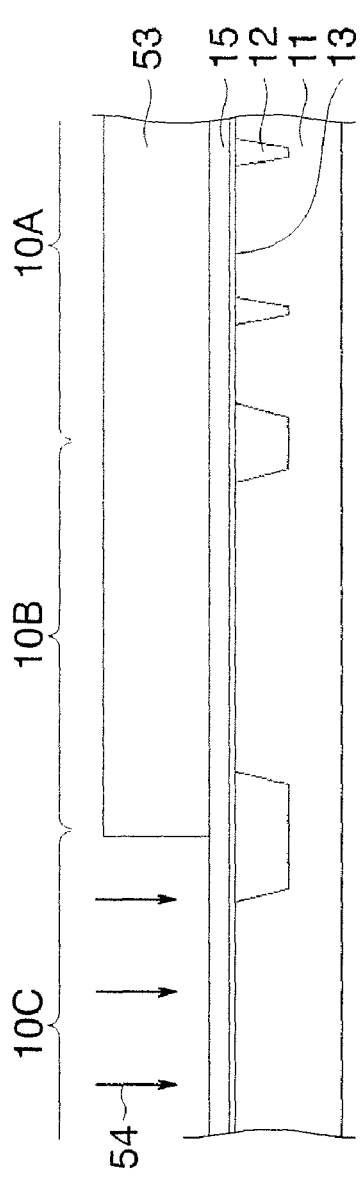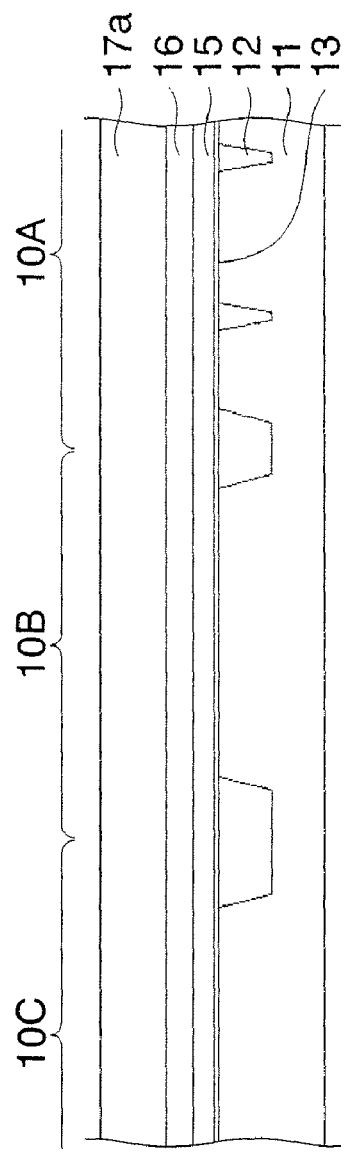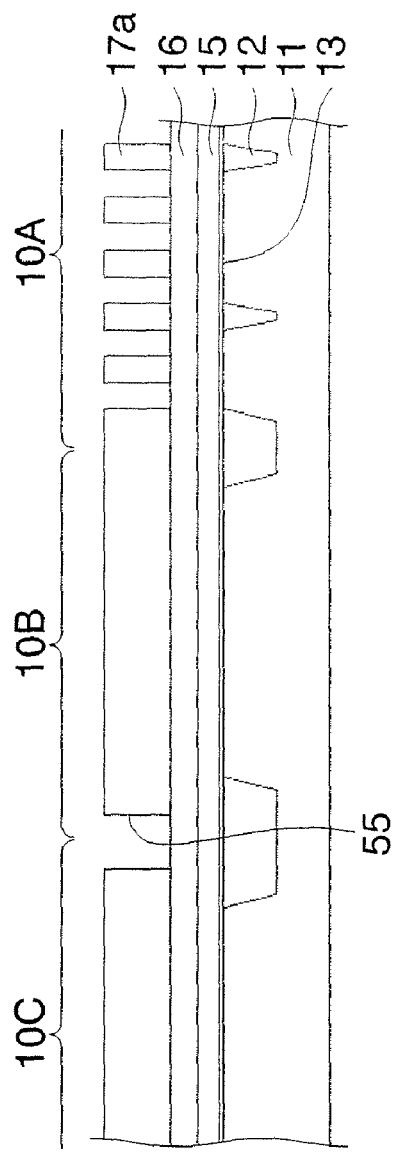

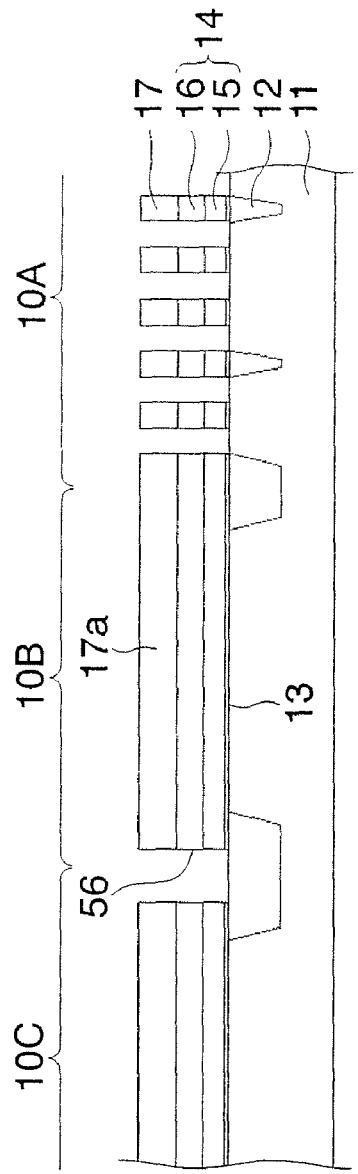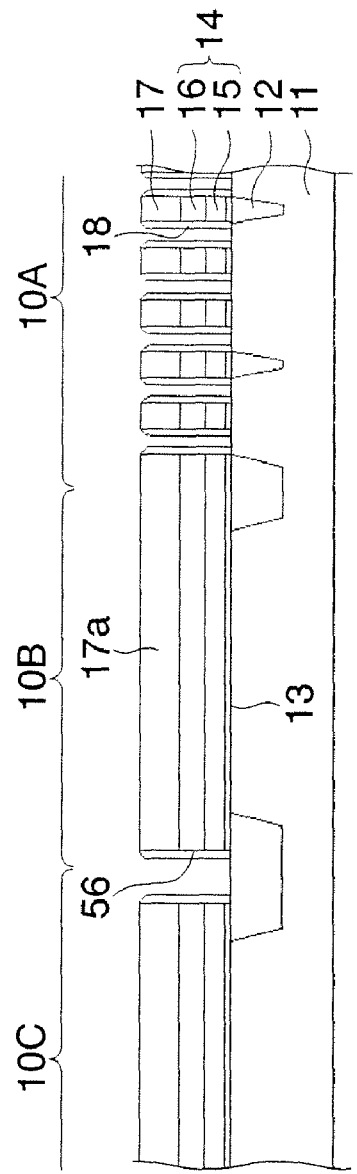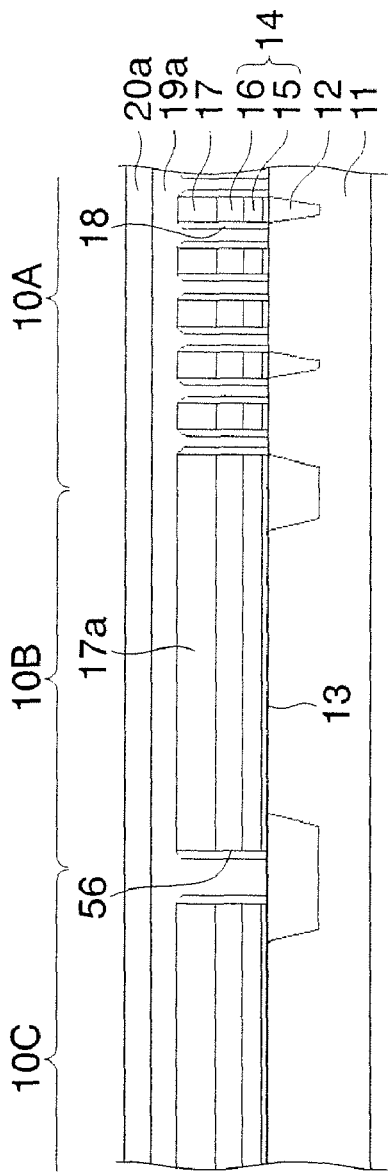

US 7,879,702 B2

METHOD FOR MANUFACTURING A SEMICONDUCTOR DEVICE INCLUDING A MEMORY CELL ARRAY AREA AND PERIPHERAL CIRCUIT AREA

This application is based upon and claims the benefit of priority from Japanese patent application No. 2006-187779, the disclosure of which is incorporated herein in its entirety by reference.

BACKGROUND OF THE INVENTION

1. Field of the Invention

The present invention relates to a method for manufacturing a semiconductor device and, more particularly, to a method for manufacturing a semiconductor device including a memory cell array area and a peripheral circuit area.

2. Description of Related Art

A DRAM (Dynamic Random Access Memory) device generally includes a memory cell array area in which a plurality of memory cells are arranged in a two-dimensional array, and a peripheral circuit area in which a peripheral circuit for driving the memory cells is disposed. The memory cells each include a MOSFET (Metal-Oxide-Semiconductor Field Effect Transistor) formed in the surface region of a semiconductor substrate, and a cell capacitor overlying the MOSFET for storing therein electric charge or data.

In a process for manufacturing the DRAM device, a gate insulation film is first for on a semiconductor substrate, followed by consecutively depositing thereon a silicon electrode film and an overlying protective film. A photolithographic and etching process is then conducted to pattern the gate insulation film, silicon electrode film and overlying protective film, to configure part of a gate electrode structure. Impurities are then implanted in the surface region of the semiconductor substrate by an ion-implantation technique using the patterned gate electrode structure as an implantation mask, thereby forming source/drain regions of the MOSFETs. A heat treatment is then performed to diffuse and activate the implanted impurities, thereby forming MOSFETs including the gate electrode and associated source/drain regions. Patent Publication JP-2006-120832A, for example, describes a DRAM device and a method for manufacturing the same.

The electric charge stored in the cell capacitors gradually decreases as the time elapses due to a junction leakage current flowing across the p-n junction in the MOSFETs. Accordingly, a refresh operation is generally performed periodically, wherein the stored electric charge is read out from the cell capacitors within a specific time interval to be stored again in the cell capacitors. There is a strong demand of a longer refresh time interval in the DRAM device for reducing the power dissipation thereof as by suppressing the junction leakage current. For this purpose, it is preferable that the source/drain regions in the memory cell array area have a lower electric-field strength across the p-n junction by employing a lower impurity concentration, and that the impurity level be lowered in the vicinity of the p-n junction by using a longer-time and higher-temperature heat treatment.

On the other hand, it is preferable in the peripheral circuit area that the impurity concentration in the source/drain regions be higher and that the channel length be smaller to accelerate the response speed, due to a strong demand for a higher operational speed thereof, differently from the source/drain regions in the memory cell array area. It is noted here by the inventor that the longer-time and higher-temperature heat treatment, employed for the sake of the memory cell array area, will inevitably diffuse the impurities excessively in the source/drain regions in the peripheral circuit area, thereby causing a short channel effect to degrade the transistor characteristics of the MOSFETs in the peripheral circuit area. Hence, it is desired that the heat treatment conducted for the memory cell array area do not excessively diffuse the impurities in the source/drain regions in the peripheral circuit area, to thereby suppress degradation of the transistor characteristics of the MOSFETs in the peripheral circuit area.

SUMMARY OF THE INVENTION

In view of the above, it is an object of the present invention to provide a method for manufacturing a semiconductor device including a memory cell array area and a peripheral circuit area, which is capable of employing a heat treatment suited to the source/drain regions in the memory cell array area and yet suppressing excessive diffusion of impurities in the source/drain regions in the peripheral circuit area.

The present invention provides a method for manufacturing a semiconductor device including consecutively: forming a doped silicon layer on a semiconductor substrate defining first through third areas, the second area being disposed adjacent to the third area; patterning a first portion of the doped silicon layer deposited on the first area to form a first gate electrode; selectively implanting impurities into the first area of the semiconductor substrate to form first source/drain regions associated with the first gate electrode; patterning a second portion of the silicon layer deposited in the second and third areas to form a second gate electrode; and selectively implanting impurities into the second and third areas of the semiconductor substrate to form second source/drain regions associated with the second gate electrode, and further including diffusing impurities in the first source/drain regions by using a heat treatment between the implanting of impurities to form the fist source/drain regions and the implanting of impurities to form the second source/drain regions.

The above and other objects, features and advantages of the present invention will be more apparent from the following description, referring to the accompanying drawings.

PREFERRED EMBODIMENT OF THE INVENTION

Figure 1:
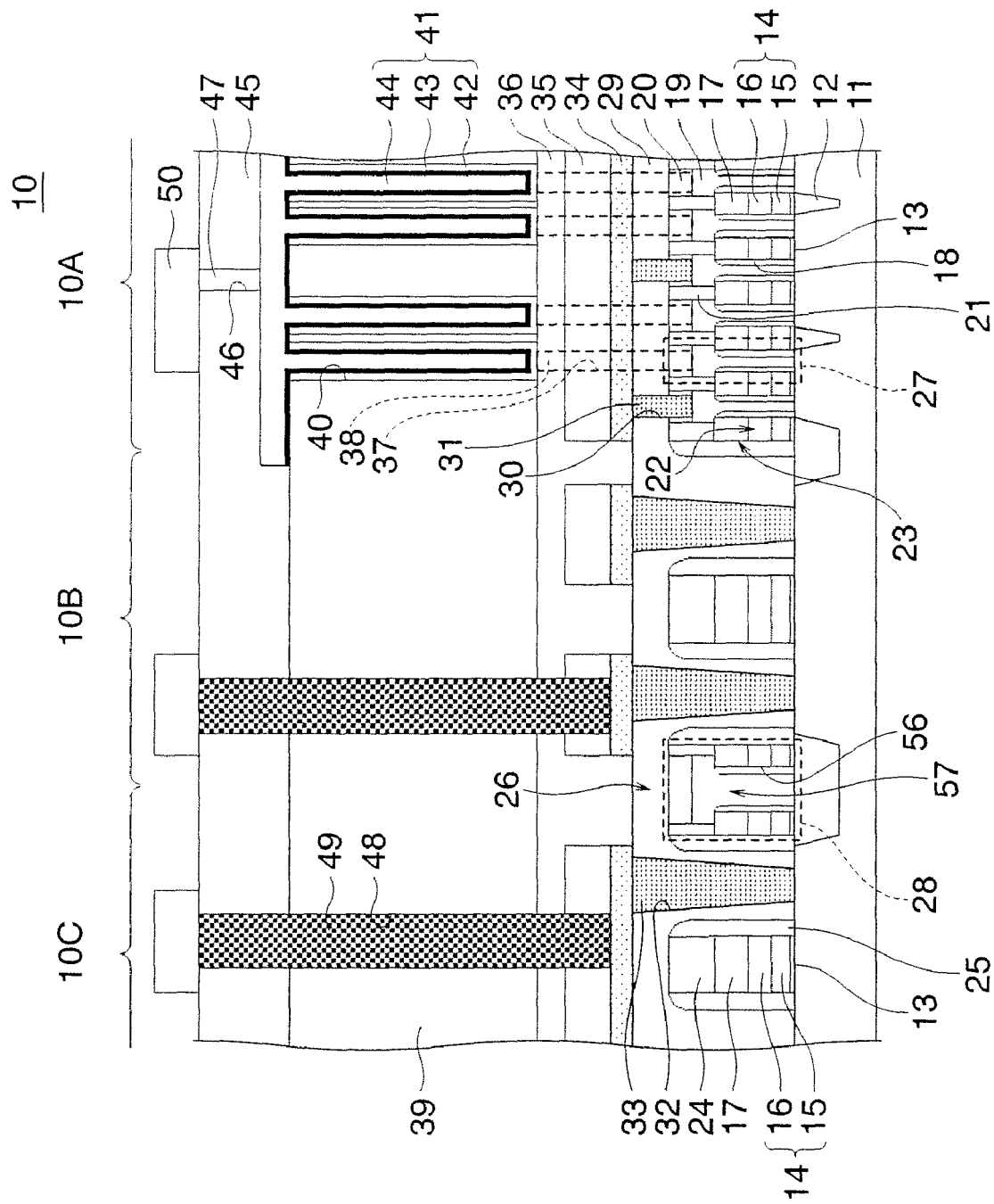
FIG. 1 is a sectional view of a semiconductor device according to an embodiment of the present invention

Now, an exemplary embodiment of the present invention will be described with reference to accompanying drawings, wherein similar constituent elements are designated by similar reference numerals. FIG. 1 shows a semiconductor device manufactured by a method according to the embodiment of the present invention. The semiconductor device 10 is a DRAM device and includes a memory cell array area 10A wherein a plurality of memory cells are arranged in a two-dimensional array, and a peripheral circuit area disposed in the periphery of the memory cell array area 10A for driving the memory cells in the memory cell array area 10A. In FIG. 1, the peripheral circuit area includes an NMOSFET area 10B wherein NMOSFETs are disposed and a PMOSFET area 10C wherein PMOSFETs are disposed.

The semiconductor device 10 includes a silicon substrate 11, and a STI (Shallow Trench Isolation) structure is formed in the surface region of the silicon substrate 11. The STI structure isolates the silicon substrate into a plurality of active regions in which MOSFETs are formed. On the silicon substrate 11 is formed a gate insulation film 13 which includes silicon oxide or silicon oxynitride, and gate electrodes 14 are formed on the gate insulation film 13. The gate electrodes 14 have a poly-metal structure including a silicon electrode layer 15 made of doped polysilicon, and an overlying metal electrode layer 16. The metal electrode layer 16 includes a tungsten nitride (WN) layer and an overlying tungsten (W) layer, for example.

Phosphor or arsenic is used as N-type impurities or dopant for the silicon electrode layer 15 in the memory cell array area 10A and the NMOSFET area 10B, whereas boron or indium is used as P-type impurities or dopant for the silicon electrode layer 15 in the PMOSFET area 10C. On the gate electrodes 14 is formed an overlying protective film 17 made of silicon nitride.

Impurities are introduced into the surface region of the silicon substrate 11 on both sides of gate electrodes 14, to form source/drain regions (not shown in the figure). The N-type impurities are introduced into the source/drain regions in the memory cell array area 10A and NMOSFET area 10B, whereas the P-type impurities are introduced into the source/drain regions in the PMOSFET area 10C. The gate electrodes 14, gate insulation film, and associated source/drain regions configure MOSFETs. Dummy gate electrodes 22 are also formed on the STI structure 12 during forming the gate electrodes 14.

A portion of the silicon substrate 11 underlying the gate insulation film 13 configures a channel formed in a well region, which is lightly doped region and receives therein the source/drain regions. Control of the impurity concentration of the channel controls the threshold voltage of the MOSFETS.

In the memory cell array area 10A, a sidewall protective film 18 made of silicon nitride is formed on both sides of the gate electrode structure including the gate insulation film 13, gate electrodes 14 and overlying protective film 17. Contact pads 19 are formed on the source/drain regions of the silicon substrate 11 exposed from the gate electrode structure. Pad protective films 20 are formed on top of the respective contact pads 19. Dummy contact pads and dummy pad protective films are also formed on the STI structure 12.

An interlayer dielectric film 21 is formed on the silicon substrate 11, top protective films 17 and sidewall protective film 18 exposed from the contact pads 19 and pad protective film 20. Top of the interlayer dielectric film 21 is flush with top of the pad protective film 20. In the vicinity of the boundary between the memory cell array area 10A and the NMOSFET area 10B, a STI sidewall structure 23 extends on the STI structure 12 in the memory cell array area 10A instead of the dummy contact pad 57 and dummy pad protective film.

In the peripheral circuit area, a top electrode protective film 24 including silicon oxide is formed on the overlying protective film 17. The top electrode protective film 24 is made of the material same as the material of the interlayer dielectric film 21. The sidewall protective film 18 including silicon nitride is formed on both sides of the gate insulation film 13, silicon electrode layer 15, metal electrode layer 16, overlying protective film 17, and top electrode protective film 24. The sidewall protective film 18 is formed also on the sidewall structure 23 extending along the periphery of the memory cell array area 10A.

In the peripheral circuit area, on-substrate separation structure 26 for dividing the silicon elevate layer 15 between the NMOSFET area 10B and the PMOSFET area 10C is formed on a specific STI structure 12 formed on the boundary between the NMOSFET area 10B and the PMOSFET area 10C. The on-substrate separation structure 26 includes a combination structure 28 shown by a dotted line, and the sidewall protective film 18 formed on both sides of the combination structure 28. The combination structure 28 is similar to a structure 27 formed in the memory cell area 10A and including two of half portion of the gate electrode structure. The combination structure 28 includes a separation slot 56 formed in the overlying protective film 17, gate insulation film 13, silicon electrode layer 15, and metal electrode layer 16. The dummy contact pad 57 extends vertically along the separation slot 56.

An interlayer dielectric film 29 covers the pad protective film 20, interlayer dielectric film 21, top protective film 24, and sidewall protective film 18 on the silicon substrate 11. In the memory cell array area 10A, contact holes 30 penetrating the interlayer dielectric film 29 and pad protective film 20 are formed to expose top of the contact pads 19, the contact holes 30 receiving therein contact plugs 31. In the peripheral circuit area, contact holes 32 penetrating the interlayer dielectric film 29 are formed to expose the source/drain regions, the contact holes 32 receiving therein contact plugs 33.

Bit lines 34 are formed on the interlayer dielectric film 29 to connect to top of the contact plugs 31 and 33, the bit lines 34 having thereon overlying protective film 35. Interlevel dielectric films 36 and 39 are formed on the interlevel dielectric film 29 to cover the overlying protective film 35 and bit lines 34. In the memory cell array area 10A, cylindrical holes 40 are formed in the interlayer dielectric film 39, receiving therein cylindrical capacitors 41.

The capacitors 41 include bottom electrodes 42 formed on the bottom and sidewall of the cylindrical holes 40, a capacitor insulation film 43 formed on the bottom electrodes 42, and a top electrode film 44 formed on the capacitor insulation film 43 to fill the internal of the cylindrical holes 40. Between the top of the contact pads 19 and the bottom of the bottom electrodes 42, there are provided through-holes 37 which penetrate the pad protective films 20, interlayer dielectric film 29 and interlayer dielectric film 36, and receive therein via-plugs 38.

An interlayer dielectric film 45 covers the top electrode film 44 on the interlayer dielectric film 39. In the memory cell array area 10A, through-holes 46 penetrate the interlayer dielectric film 45 to expose therethrough part of the top electrode film 44, receiving therein via-plugs 47. In the peripheral circuit area, through-holes 48 penetrate the protective films 35, interlayer dielectric film 36, and interlayer dielectric film 45 to expose part of the bit lines 34, receiving therein via-plugs 49. On the interlayer dielectric film 45, there are provided top interconnections connecting to via-plugs 47 and 49.

The semiconductor device 10 manufactured by the method of the present embodiment includes the on-substrate separation structure 26 which divides the silicon electrode layer 25 at the boundary between the NMOSFET area 10B and PMOSFET area 10C. The on-substrate separation structure 26 prevents the N-type impurities and P-type impurities in the silicon electrode layer 15 from diffusing between the NMOSFET area 10B and the PMOSFET area 10C, during the heat treatment for forming the source/drain regions in the memory cell array area 10A. This suppresses depletion of the silicon electrode layer 15 in the peripheral circuit area to thereby improve the characteristics of the resultant MOSFETs.

Figure 2J:
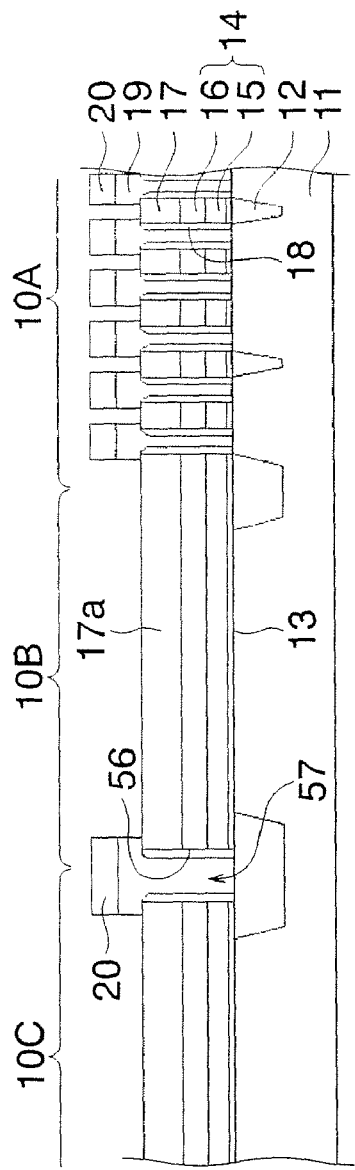
FIGS. 2A to 2N are sectional views of the semiconductor device of FIG. 1 in consecutive steps of a process for fabricating the same.
Figure 2K:
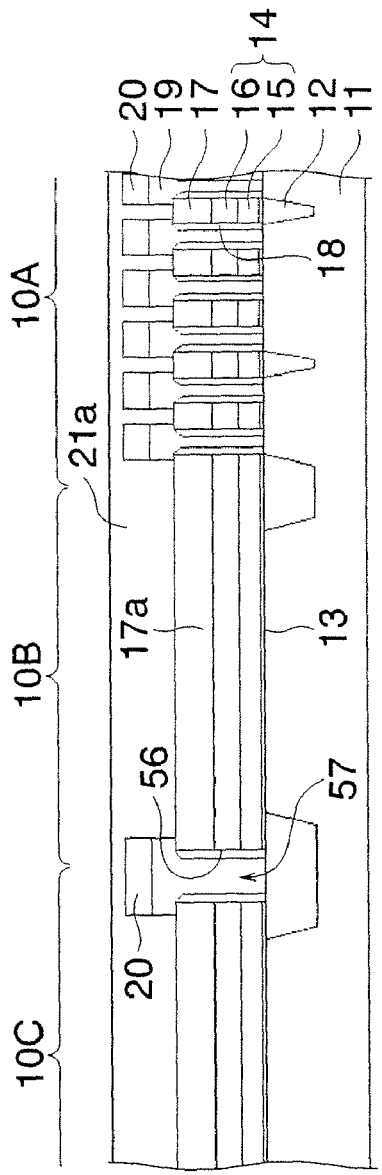
Figure 2L:
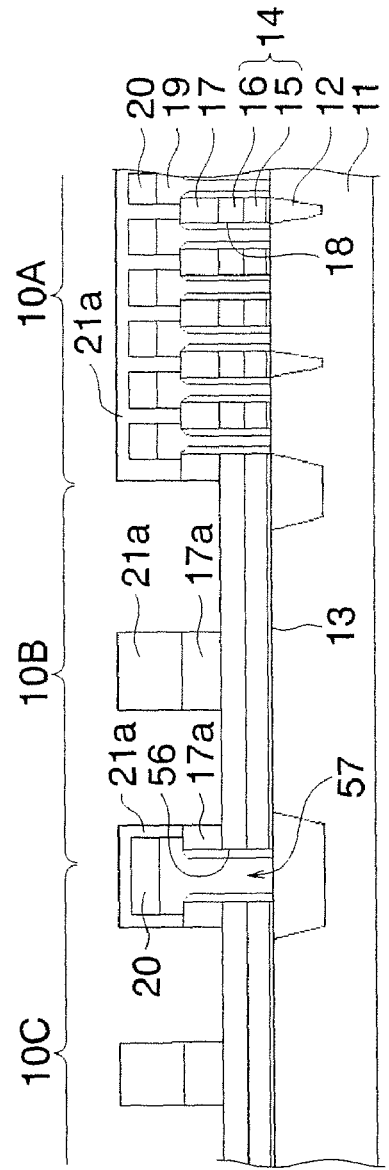
Figure 2M:
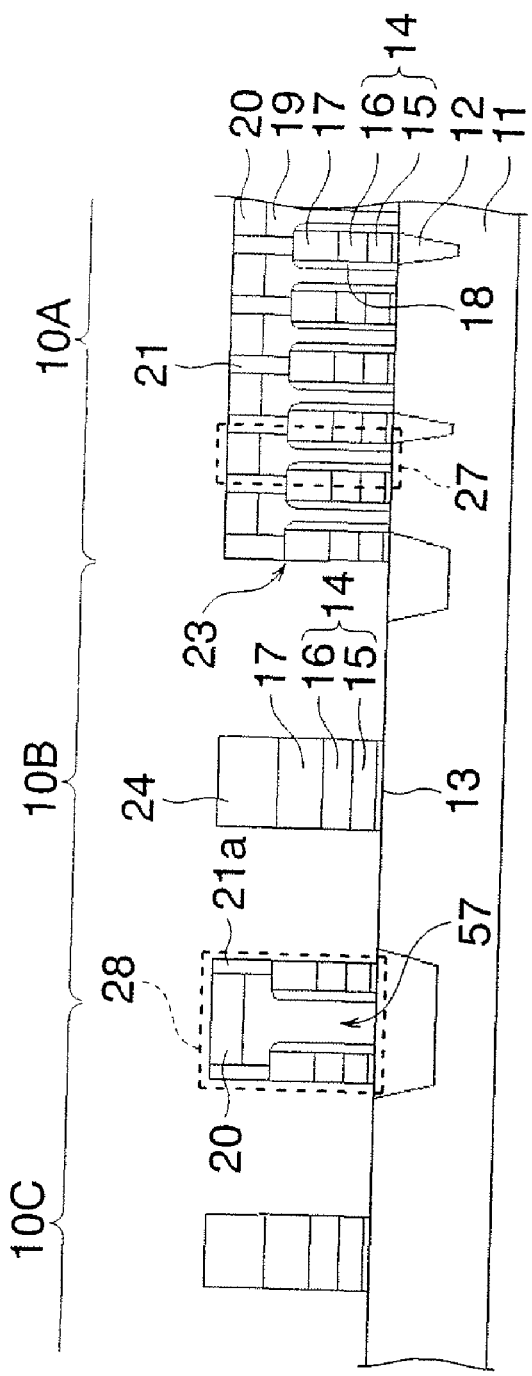
Figure 2N:
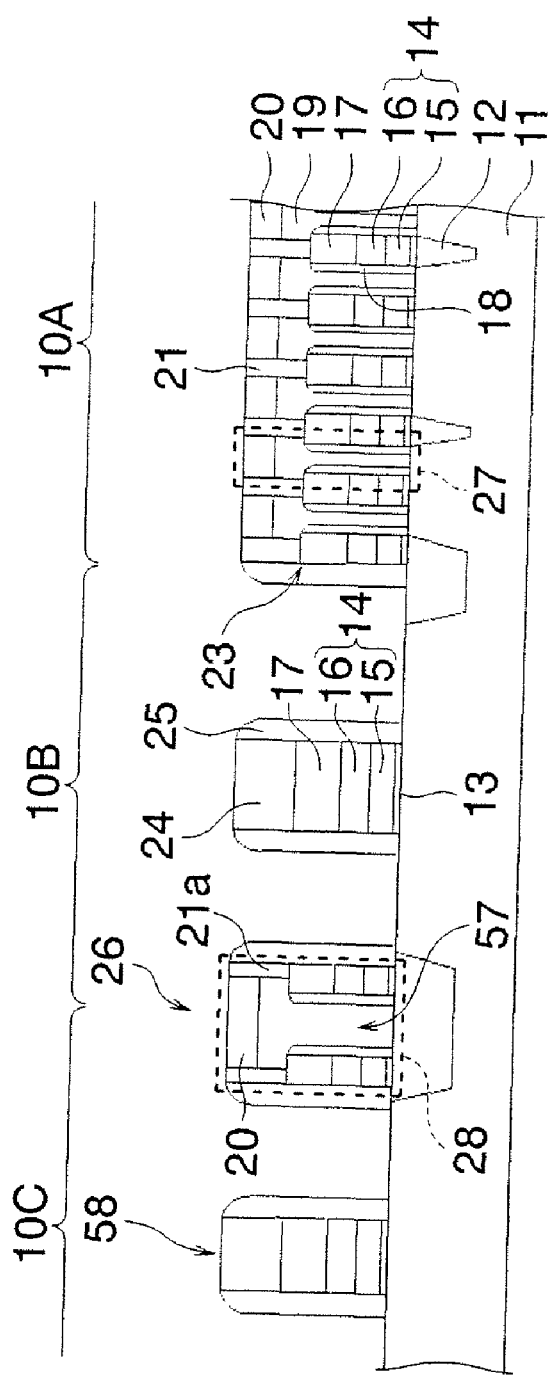

FIGS. 2A to 2N are sectional views showing the semiconductor device 10 of FIG. 1 in consecutive steps of a process for manufacturing the semiconductor device. As shown in FIG. 2A, the STI structure 12 is first formed on the silicon substrate 11, for isolating active regions for forming therein MOSFETs. Impurity ions are then implanted into the surface region of the silicon substrate 11 to form well regions, followed by forming a gate insulation film 13 made of silicon oxide or silicon nitride on the silicon substrate 11. Thereafter, as shown in FIG. 2B, a silicon electrode layer 15 is deposited on the gate insulation film 13 in an amorphous state to a thickness of 100 nm.

Subsequently, a resist pattern 51 is formed to cover the silicon electrode layer 15 in the PMOSFET area 10C by using a known photolithographic technique. Thereafter, as shown by numerals 52 FIG. 2C, N-type impurities are implanted in to the silicon electrode layer 15 in the memory cell array area 10A and NMOSFET area 10B exposed from the resist pattern 51. As N-type impurities, phosphor or arsenic may be used herein for example. After implanting the N-type impurities, the resist pattern 51 is removed.

Subsequently, another resist pattern 53 is formed to cover the silicon electrode layer 15 in the memory cell array area 10A and NMOSFET area 10B by using a known photolithographic technique. Thereafter, as shown by numerals 54 in FIG. 2D, P-type impurities are implanted into the silicon electrode layer 15 in the PMOSFET area 10C exposed from the resist pattern 53. As the P-type impurities, boron or indium may be used herein, for example. After implanting the P-type impurities, the resist pattern 53 is removed.

Subsequently, a metal electrode layer 16 and a silicon nitride film 17a are consecutively formed on the silicon electrode layer 15, as shown in FIG. 2E. The metal electrode layer 16 may include a tungsten nitride film and an overlying tungsten film, for example. Thereafter, another resist pattern is formed on the silicon nitride film 17a by using a known photolithographic technique, followed by patterning the silicon nitride film 17a by using the resist pattern as an etching mask, as shown in FIG. 2F. During patterning the silicon nitride film 17a, a portion of the silicon nitride film 17a provided in the memory cell array area 10A is left, whereas in the peripheral circuit area, openings 55 are formed at the boundary between the NMOSFET area 10B and the PMOSFET area 10C to leave other portion of the silicon nitride film 17a.

Subsequently, as shown in FIG. 2G the gate insulation film 13, silicon electrode layer 15, and metal electrode layer 16 are patterned by a dry etching technique using the patterned silicon nitride film 17a as an etching mask Thus, the gate electrodes 14 including the silicon electrode layer 15 and metal electrode layer 16 are formed in the memory cell array area 10A. In the peripheral circuit area, the separation slot 56 is formed exposing the SDI structure 12 at the boundary between the NMOSFET area 10B and the PMOSFET area 10C. By the dry etching, the upper portion of the silicon nitride film 17a is also removed to have a reduced thickness. A portion of the silicon nitride film 17a formed on the gate electrodes 14 is configured as the overlying protective film 17 in the memory cell array area 10A.

Subsequently, ion-implantation is conducted using the patterned silicon nitride film 17a as an implantation mask in the memory cell array area 10A, wherein N-type impurities are introduced in the surface region of the silicon substrate 11 exposed from the overlying protective film 17 to thereby form source/drain regions. Thereafter, the sidewall protective film 18 is formed to cover both sides of the gate insulation film 13, gate electrode 14, and overlying protective film 17 by using a known technique, as shown in FIG. 2H. The sidewall protective film 18 is formed also on the sidewall of the separation slot 56.

Subsequently, a doped polysilicon film 19a is deposited on the entire surface including the gap between adjacent gate electrodes 14 and the internal of the separation slot 56, followed by depositing a silicon oxide film 20a on the doped polysilicon film 19a, as shown in FIG. 2I. Thereafter, the silicon oxide film 20a is patterned using a known photolithographic technique and a dry etching technique. During patterning the silicon oxide film 20a, a portion of the silicon oxide film 20a is left for forming contact pads 19 later in the memory cell array area 10A, whereas in the peripheral circuit area, another portion of the silicon nitride film 20a is left in the vicinity of the separation slot 56, to thereby remove the other portion.

The polysilicon film 19a is then patterned by a dry etching technique using the patterned oxide film 20a as an etching mask. Thus, contact pads 19 are formed which connect to the source/drain regions in the memory cell array area 10A. In the peripheral circuit area, dummy contact pad 57 is formed in the separation slot 56, and on a portion of the silicon nitride film 17a in the vicinity of the separation slot 56, as shown in FIG. 2J.

Subsequently, a first heat treatment is performed to diffuse the N-type impurities in the surface region of the silicon substrate 11 in the memory cell array area 10A. The first heat treatment includes an initial short-time heat treatment conducted at a high temperature for activating the implanted impurities, and a subsequent long-time heat treatment conducted at a high temperature for reducing the impurity level generated by the initial heat treatment. The initial heat treatment is performed, for example, for 30 seconds at a substrate temperature of 1000 degrees C. The subsequent heat treatment is performed for 5 minutes or more, for example, 10 minutes, at a substrate temperature of about 800 degrees C.

During the first heat treatment, the contact resistance between the silicon substrate 11 and the contact pads 19 is reduced in the memory cell array area 10A. The silicon electrode layer 15 is divided between the NMOSFET area 10B and PMOSFET area 10C by the separation slot 56, and the sidewall protective film 18 formed on the sidewall of the separation slot 56 is made of silicon nitride, which scarcely diffuses the impurities. Thus, the N-type impurities and P-type impurities are prevented from diffusing within the silicon electrode layer 15 between the NMOSFET area 10B and the PMOSFET area 10C.

Subsequently, a silicon oxide film 21a is deposited on the entire surface including the silicon nitride film 17a, contact pads 19, and pad protective films 20, and subjected to a planarization treatment such as a CMP process, as shown FIG. 2K. Thereafter, the silicon nitride film 17a and silicon oxide film 21a are patterned using a known photolithographic technique and dry etching technique in the peripheral circuit area, FIG. 2L. During patterning the silicon nitride film 17a and oxide film 21a, a portion of these films 18a and 21a in the entire memory cell array area 10A is left, whereas in the peripheral circuit area, another portion of these films 17a and 21a in the region for forming therein the gate electrodes 14 and the vicinity of the dummy contact pad 57 is left, to remove the other portion.

Subsequently, a dry etching process is performed using the patterned silicon nitride film 17a and silicon oxide film 21a as an etching mask, to pattern the metal electrode layer 16 and silicon electrode layer 15 in the peripheral circuit area, as shown in FIG. 2M. Thus, in the peripheral circuit area, gate electrodes 14 are formed, and combination structure 28 is formed in the vicinity of the dummy contact pad 57. During this dry etching, the upper portion of the silicon oxide film 21a is removed to have a reduced film thickness. In the memory cell array area 10A, the silicon oxide film 21a formed on the pad protective films 20 is removed, whereas in the peripheral circuit area, the silicon oxide film 21a on the pad protective film 20 formed on the dummy contact pad 57 is removed.

The silicon oxide film 21a deposited in the gap between adjacent contact pads 19 and adjacent pieces of protective film 20 configures an interlayer dielectric film 21 in the memory cell array area 10A. The silicon nitride film 17a formed on the gate electrodes 14 in the peripheral circuit area configures the overlying protective film 17, whereas the silicon oxide film 21a formed on the overlying protective film 17 configures the top protective film 24.

Subsequently, by using a known photolithographic technique, N-type impurities are selectively implanted into the surface region of the silicon substrate 11 exposed from the top protective film 24 in the NMOSFET area 10B, to thereby form lightly-doped regions for the source/drain regions. Thereafter, by using a known photolithographic technique, P-type impurities are selectively implanted into the surface region of the silicon substrate 11 exposed from the top protective film 24 in the PMOSFET area 10C, to thereby form lightly-doped regions for the source/drain regions.

Subsequently, a silicon nitride film is deposited on the entire surface, followed by etch-back thereof to form sidewall protective films 25, as shown in FIG. 2N. In the memory cell array area 10A, the sidewall protective film 25 is formed on the sidewall structure 23, whereas in the peripheral circuit area, the sidewall protective films 25 is formed on both sides of the gate electrode structure 58 including the gate insulation film 13, gate electrodes 14, overlying protective films 17, and top protective films 24, as well as on both sides of the combination structure 28. The on-substrate separation structure 26 is thus formed at the boundary between the NMOSFET area 10B and the PMOSFET area 10C of the peripheral circuit area.

Subsequently, by using a known photolithographic technique, N-type impurities are selectively implanted into the surface region of the silicon substrate 11 exposed from the top protective film 24 and sidewall protective film 25, in the NMOSFET area 10B, to thereby form heavily-doped source/drain regions. Thereafter, by using a known photolithographic technique, P-type impurities are selectively implanted into the surface region of the silicon substrate 11 exposed from the top protective film 24 and sidewall protective film 25, in the PMOSFET area 10C, to thereby form heavily-doped source/drain regions.

Subsequently, a second heat treatment is conducted at a temperature lower than the temperature of the first heat treatment for a time length smaller than the time length of the first heat treatment. The second heat treatment diffuses the impurities introduced into the silicon substrate 11 in the peripheral circuit area. The second heat treatment is performed for one minute at 800 degrees C., for example.

Subsequently, an interlevel dielectric film 29 is deposited on the entire surface including the pad protective films 20, interlayer dielectric film 21, silicon oxide film 21a, top protective films 24, and sidewall protective films 25. After forming contact holes 30 penetrating the pad protective films 20 and interlayer dielectric film 29 to expose top of the contact pads 19 in the memory cell array area 10A, a conductive material is deposited to fill the contact holes 30, thereby forming contact plugs 31 therein. In the peripheral circuit area, contact holes 32 are formed to penetrate the interlayer dielectric film 29 and expose the source/drain regions, followed by depositing a conductive material in the contact holes 32, thereby forming contact plugs 33 therein.

Subsequently, a conductive material and a silicon nitride film are consecutively deposited on the interlayer dielectric film 29, followed by patterning the conductive material and silicon nitride film by using known photolithographic technique and dry etching technique, to form bit lines 34 connecting to the contact plugs 31 and 33 and the overlying protective film 35. Thereafter, an interlayer dielectric film 36 is deposited to cover the bit lines 34 and overlying protective film 35 on the interlayer dielectric film 29. The pad protective films 20 and interlayer dielectric films 29 and 36 are then penetrated to form therein through-holes 37 which expose top of the contact pads 19, followed by depositing a conductive material to fill the through-holes 37 and form via-plugs 38 therein.

Subsequently, an interlayer dielectric film 39 is deposited onto the interlayer dielectric film 36 and via-plugs 38, followed by patterning thereof to form cylindrical holes 40 which expose therethrough top of the via-plugs 38. After forming bottom electrodes 42 in the bottom and sidewall of the cylindrical holes 40, a capacitor insulation film 43 is formed on the bottom electrode 42s. The cylindrical hole 40 is then filled with a top electrode film 44 via the capacitor insulation film 43. The bottom electrodes 42, capacitor insulation film 43, and top electrode film 44 configure capacitors 41. Thereafter, an interlayer dielectric film 45 is deposited to cover the top electrode film 44 on the interlayer dielectric film 39.

The interlayer dielectric film 45 is patterned to form therein through-holes 46 exposing the top electrode film 44, followed by depositing a conductive material to fill the through-holes 46 and form via-plugs 47 therein. Overlying protective films 35 and interlayer dielectric films 36, 39, and 45 are then patterned to form through-holes 48 exposing therethrough the bit lines 34, followed by depositing a conductive material to fill the through-holes 48 and form via-plugs 49 therein. The semiconductor device 10 is then completed as by using the process of forming the top interconnections 50 connecting to the via-plugs 47 and 49 on the interlayer dielectric film 45.

According to the method of the present embodiment, the first heat treatment is performed between the steps of implanting impurities to form the source/drain regions in the memory cell array area 10A and implanting impurities to form the source/drain regions in the peripheral circuit area. This prevents excessive diffusion of the impurities in the source/drain regions in the peripheral circuit area, while employing the heat treatment suited to the source/drain regions in the memory cell army area 10A. Thus, the junction leakage current of MOSFETs formed in the memory cell array area 10A can be suppressed, while preventing the short channel effect of the MOSFETs in the peripheral circuit area.

In addition, forming the separation slot 56 dividing the silicon electrode layer 15 at the boundary between the NMOSFET area 10B and the PMOSFET area 10C, the first heat treatment suppresses diffusion of the N-type impurities and P-type impurities within the silicon electrode layer 15 between the NMOSFET area 10B and the PMOSFET area 10C.

Etching residuals formed in the vicinity of the separation slot 56 after the etching step are reduced by forming the dummy contact pad 57 within the separation slot 56 via the sidewall protective film 18.

Although the first heat treatment is conducted after forming the contact pads 19 in the method of the above embodiment, the first heat treatment may be conducted at any stage so long as the first heat treatment is conducted after the implantation of impurities into the source/drain regions in the memory cell array area 10A and before implanting impurities into the source/drain regions in the peripheral circuit area.

Figure 3A:
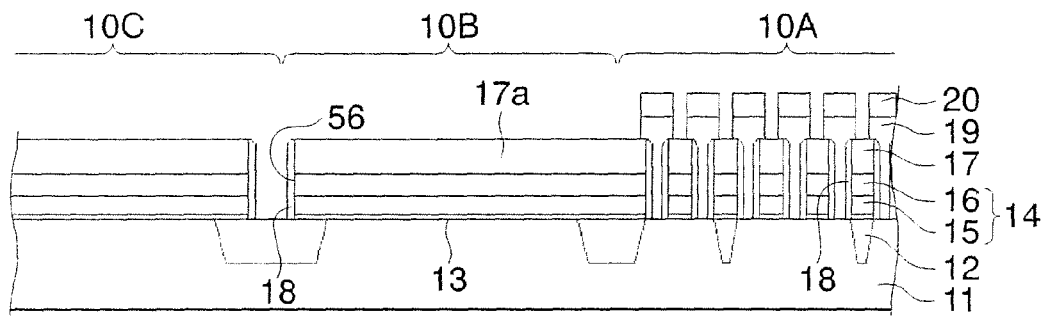
FIGS. 3A to 3D are sectional views of a semiconductor device in consecutive steps of a process for fabricating the semiconductor device according to a modification of the above embodiment.

FIGS. 3A to 3D are sectional views of a semiconductor device in consecutive steps of a process for manufacturing the same according to a modification from the above embodiment. The process of this modification is similar to the process of the above embodiment, except for the steps of FIGS. 2J and 2L of the above embodiment. Instead of the step of FIG. 2J for patterning the polysilicon film 19a and silicon oxide film 21a, the polysilicon film 19a and silicon oxide film 20a are completely removed from the internal of the separation slot 56 and the vicinity thereof in the peripheral circuit area, as shown in FIG. 3A.

Figure 3B:
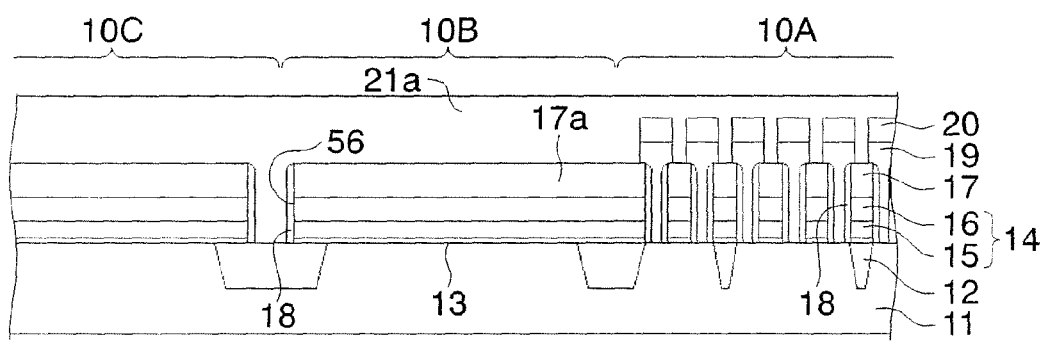
Figure 3C:
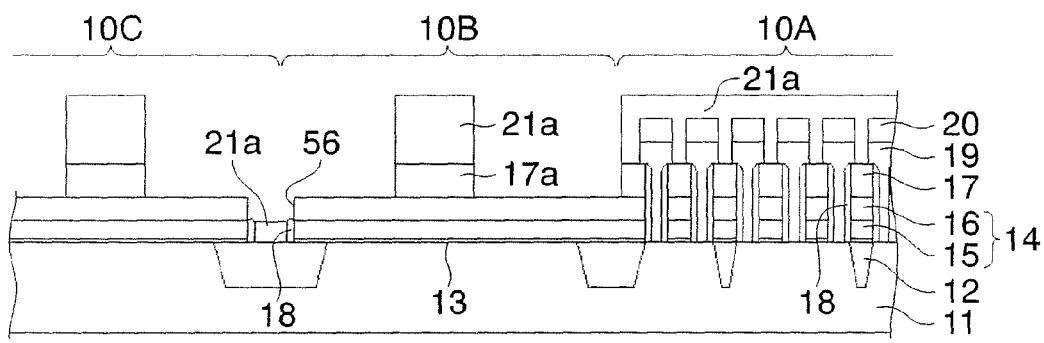

During the step of FIG. 2K for depositing the silicon oxide film 21a, the separation slot 56 is filled with the silicon oxide film 21a, as shown in FIG. 3B. During the step of FIG. 2L for patterning the silicon nitride film 17a and silicon oxide film 21a, dry etching is performed within the internal of the separation slot 56 and vicinity thereof, as shown in FIG. 3C. The step of FIG. 2M for patting the gate insulation film 13, silicon electrode layer 15, and metal electrode layer 16 provides the structure shown in FIG. 3D.

Figure 3D:
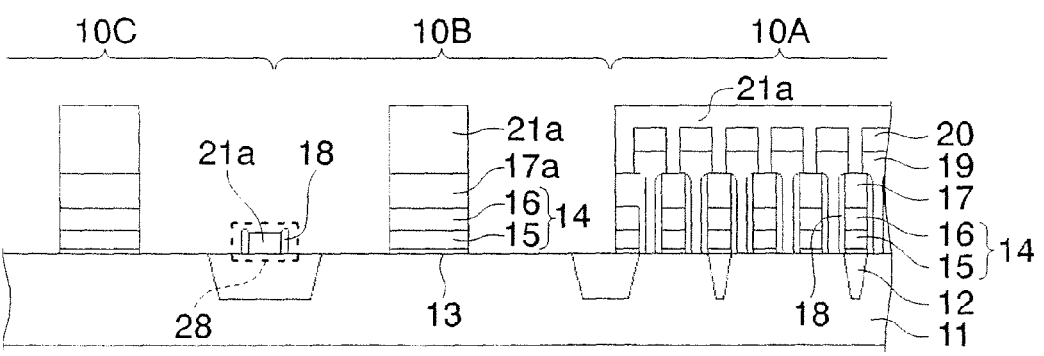

In the internal of the separation slot 56, as shown in FIGS. 3C and 3D, there are some residues of sidewall protective films 18 and silicon oxide films 21a after the etching step. However, after the step of FIG. 2G for forming the separation slot 56 on the STI structure 12, the etching residues will remain on the STI structure 12, thereby reducing the adverse influence on the performance or fabrication process of the semiconductor device.

In the above modification, the silicon electrode layer 15 is divided between the NMOSFET area 10B and the PMOSFET area 10C by the separation slot 56 during the first heat treatment subsequent to the step of FIG. 2J. This suppresses diffusion of the N-type impurities and P-type impurities within the silicon electrode layer 15 between the NMOSFET area 10B and the PMOSFET area 10C. The N-type purities and P-type impurities may be referred as first-conductivity-type impurities and second-conductivity-impurities, respectively, and vice versa.

In addition, it is unnecessary to form the pattern for the vicinity of the separation slot 56 during forming the mask pattern prior to the step of FIG. 2J or 2L, and it is sufficient to form only the pattern for the memory cell array area 10A during the step of FIG. 2J or 2L. Therefore, the exposure process for forming the resist pattern is simplified, as compared to the above embodiment.

During the step of FIG. 3C for patterning the silicon nitride film 17a and silicon oxide film 21a, the sidewall protective film 18 and silicon oxide film 21a may be removed completely. In addition, during subsequent patterning of the gate insulation film 13, silicon electrode layer 15 and metal electrode layer 16, the silicon oxide film 21a on the pad protective films 20 may be completely removed, similarly to the step of FIG. 2M.

In the conventional semiconductor device, unlike the above embodiment and modification, the silicon electrode layer 15 of the PMOSFETs in the peripheral circuit area is of an N-type, and a buried channel structure is employed wherein top of the channel is slightly below the top surface of the silicon substrate 11. This structure of the conventional PMOSFETs incurs a problem in that the difference in the work function between the silicon substrate 11 and the silicon electrode layer 15 impedes a lower threshold voltage of the PMOSFETs.

To solve the above problem in the present embodiment, the silicon electrode layer 15 in the PMOSFETs is of a P-type, and a surface channel structure is employed wherein top of the channel is flush with the top of the silicon substrate 11 in the peripheral circuit area. This reduces the difference in the work function, to thereby reduce the threshold voltage of the PMOSFETs. The structure, wherein the silicon electrode layer 15 of PMOSFETs is of P-type and the silicon electrode layer 17 of NMOSFETs is of a N-type, is generally referred to as PN-dual-gate structure, and the process for manufacturing such a structure is referred to as PN-dual-gate process. The PN-dual-gate structure and PN-dual-gate process are adopted in the technical field of the uptodate logic semiconductor devices.

While the invention has been particularly shown and described with reference to exemplary embodiment and a modification thereof, the invention is not limited to these embodiment and modification. It will be understood by those of ordinary skill in the art that various changes in form and details may be made therein without departing from the spirit and scope of the present invention as defined in the claims.

What is claimed is:

1. A method for manufacturing a semiconductor device comprising consecutively:

forming a doped silicon layer on a semiconductor substrate defining first, second, and third areas, said second area being disposed adjacent to said third area;

patterning a first portion of said doped silicon layer formed on said first area, to form a first gate electrode;

selectively implanting impurities into said first area of said semiconductor substrate, to form first source/drain regions associated with said first gate electrode;

patterning a second portion of said doped silicon layer formed on said second and third areas, to form a second gate electrode; and selectively implanting impurities into said second and third areas of said semiconductor substrate, to form second source/drain regions associated with said second gate electrode, and further comprising:

diffusing impurities in said first source/drain regions by using a heat treatment between said steps of selectively implanting of impurities to form said first source/drain regions and selectively implanting of impurities to form said second source/drain regions.

2. The method according to claim 1, wherein said forming of doped silicon layer includes depositing a non-doped polysilicon layer on said semiconductor substrate, implanting first-conductivity-type impurities into a part of said polysilicon layer to form said first and second portions of said doped silicon layer, and implanting second-conductivity-type impurities into another part of said polysilicon layer to form said third portion of said doped silicon layer.

3. The method according to claim 1, further comprising, between said forming said doped silicon layer and said patterning said first portion, depositing a metal layer on said doped silicon layer, wherein said first and second gate electrodes includes said doped silicon layer and said metal layer.

4. The method according to claim 1, wherein said patterning said first portion forms a separation slot dividing said doped silicon layer between said second area and said third area.

5. The method according to claim 4, further comprising, between said patterning said first portion and said patterning said second portion, forming a sidewall protective film on a sidewall of said first gate electrode and a sidewall of said separation slot.

6. The method according to claim 5, further comprising, between said forming the sidewall protective film and said patterning said second portion, forming a contact electrode in a gap between adjacent two of a plurality of said first gate electrode and in said separation slot, said contact electrode connecting to said semiconductor substrate.

* * * * *